United States Patent
Kung et al.

(10) Patent No.: US 7,005,327 B2
(45) Date of Patent: Feb. 28, 2006

(54) PROCESS AND STRUCTURE FOR SEMICONDUCTOR PACKAGE

(75) Inventors: Wei-Chun Kung, Kaohsiung (TW); Liamh-Cheng Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 16 days.

(21) Appl. No.: 10/605,056

(22) Filed: Sep. 5, 2003

(65) Prior Publication Data

US 2004/0115862 A1    Jun. 17, 2004

(30) Foreign Application Priority Data

Sep. 11, 2002    (TW) .............................. 91120701 A

(51) Int. Cl.
*H01L 21/44*    (2006.01)
(52) U.S. Cl. ...................................... 438/125; 438/126
(58) Field of Classification Search ............... 438/125, 438/126
See application file for complete search history.

(56) References Cited

U.S. PATENT DOCUMENTS

| | | | | | |
|---|---|---|---|---|---|
| 5,200,362 | A | * | 4/1993 | Lin et al. ...................... | 29/841 |
| 5,509,203 | A | * | 4/1996 | Yamashita .................... | 29/879 |
| 5,817,545 | A | * | 10/1998 | Wang et al. ................. | 438/127 |
| 6,022,761 | A | * | 2/2000 | Grupen-Shemansky et al. ........................... | 438/125 |
| 2002/0142520 | A1 | * | 10/2002 | Ino ............................ | 438/124 |
| 2003/0022477 | A1 | * | 1/2003 | Hsieh et al. ................ | 438/612 |

* cited by examiner

*Primary Examiner*—David S. Blum
(74) *Attorney, Agent, or Firm*—Jianq Chyun IP Office

(57) ABSTRACT

A packaging process for a semiconductor chip that includes the following steps. A carrier having an upper surface and a corresponding lower surface is provided. A photoresist layer is formed on the upper surface of the carrier. A plurality of photoresist openings that expose the carrier is formed in the photoresist layer. A plurality of openings that connects with the photoresist openings are formed in the carrier. A tape is attached to the lower surface of the carrier. The body is filled into the openings of the carrier. A chip is mounted onto the upper surface of the carrier and electrically connected therewith. Finally, the tape is removed from the lower surface of the carrier.

9 Claims, 11 Drawing Sheets

PROCESS AND STRUCTURE FOR SEMICONDUCTOR PACKAGE

CROSS REFERENCE TO RELATED APPLICATIONS

This application claims the priority benefit of Taiwan application serial no. 91120701, filed on Sep. 11, 2002.

BACKGROUND OF INVENTION

1. Field of Invention

The present invention relates to a package process and structure. More particularly, the present invention relates to a semiconductor packaging process and a structure having an improved processing reliability.

2. Description of Related Art

In this information age, electronic products have become indispensable tools in every part of our daily life. At the core of each electronic product is usually a silicon chip that connects with other chips or passive electrical devices through a substrate. Since the chip is firmly attached as well as electrically connected to the substrate through a packaging process, a number of packaging structures have been developed such as bump chip carrier (BCC) package, film package and quad flat no-lead (QFN) package. All these packages have superior electrical performance and heat dissipation capacity.

However, in a bump chip carrier (BCC) package, the carrier for supporting the chip package must be removed by etching in the final step. Since the carrier is made from copper, the etched away copper material may leak into the surroundings causing metallic contamination. In addition, if the etching solution is improperly mixed or the ingredients thereof are slightly out of proportion, either the carrier is incompletely removed or the metallic contact surface is over-removed.

In the fabrication of a film package, two reflow steps are required to connect a film with a substrate electrically. Solder balls are implanted on the film in the first reflow step, while the film is attached to the substrate through the solder balls in a second reflow step. Meanwhile, each reflow operation causes some warpage of the film. In addition, since the film is thin relative to the substrate, the warpage of the film is intensified.

In the fabrication of a quad flat no-lead (QFN) package, the leads thereof are attached to a carrier through a tape. Since the tape is made from a soft material, a press head of a wire-bonding machine, when pressing wires onto the leads, caves into the tape resulting in a shift of the leads. Therefore, the wire-bonding head can hardly target the leads with any accuracy. Ultimately, reliability of the connection between the conductive wire and the lead is compromised.

SUMMARY OF INVENTION

Accordingly, one object of the present invention is to provide a packaging process capable of producing a package having the advantages of the ball chip carrier package, the film package and the quad flat no-lead package without their associated disadvantages.

A second object of this invention is to provide a packaging process and a package structure capable of reducing heavy-metal contamination due to a metal-etching operation.

A third object of this invention is to provide a packaging process and a package structure capable of producing a substrate with superior surface planarity.

A fourth object of this invention is to provide a packaging process and a package structure capable of preventing the warpage of a substrate.

To achieve these and other advantages and in accordance with the purpose of the invention, as embodied and broadly described herein, the invention provides a packaging process that includes the following steps. First, a carrier having an upper surface and a corresponding lower surface is provided. A photoresist layer is formed over the upper surface of the carrier. A plurality of photoresist openings are formed through the photoresist layer to expose the carrier. A plurality of openings that connect respectively with the photoresist openings are formed through the carrier. Thereafter, a tape is attached to the lower surface of the carrier. Conductive material is deposited into the openings of the carrier thereby forming a conductive body inside each opening of the carrier. A chip is positioned on the upper surface of the carrier such that the chip and the conductive body within the openings are electrically connected. Finally, the tape is removed from the lower surface of the carrier.

According to one preferred embodiment of this invention, the conductive material is deposited into the opening in the carrier by electroless plating. The conductive material can be copper or gold. Furthermore, the conductive body can be a composite layer formed by stacking multiple metallic layers, for example, by successively stacking a gold layer, a palladium layer, a nickel layer and a palladium layer.

In one embodiment of this invention, the conductive body has a die pad and a plurality of contacts. Furthermore, the chip has an active surface and a back surface. All the chip contacts are located on the active surface. The back surface of the chip is attached to the die pad through an adhesive. The chip and the die pad contacts are electrically connected through a plurality of conductive wires. One end of each conductive wire is connected to the contact of the conductive body while the other end of each conductive wire is connected to the chip contact. The chip, the conductive wires and the carrier's upper surface are enclosed by a packaging material.

According to another embodiment of this invention, the conductive body has a plurality of contacts. The chip has an active surface and a plurality of chip contacts, wherein the chip contacts are formed on the active surface. The active surface of the chip faces the upper surface of the carrier. Through a plurality of bumps, the chip is fastened onto the carrier and electrically connected to the contacts of the conductive body. One end of each bump bonds with the chip contact while the other end of the bump bonds with the die contact. After firmly attaching the chip to the carrier via the bumps, an insulation material is filled into the space between the chip and the carrier and thereby encloses the bumps.

In addition, the aforementioned packaging process can be used to fabricate a substrate with a multiple of carriers.

This invention also provides an alternative packaging process that includes the following steps. First, a carrier having an upper surface and a corresponding lower surface is provided. An opening that passes through the carrier is formed. A tape is attached to the lower surface of the carrier. Thereafter, a conductive body is formed on the upper surface of the carrier and within the openings of the carrier. The conductive body is patterned. A chip is attached to the upper surface of the carrier and the chip and the conductive body are electrically connected. Finally, the tape is removed.

This invention also provides a package structure suitable for mounting on a printed circuit board. The package structure includes a substrate and a chip. The substrate has a carrier and a conductive body. The carrier has an opening that passes through the carrier. The conductive body is filled into the opening of the carrier. The substrate is attached to and electrically connected with the printed circuit board using a surface mount technology. The chip not only sits on top of the substrate, but also connects electrically with the substrate.

In brief, the packaging process and the package structure according to this invention do not use metal-etching process and hence reduces environmental pollution considerably. In addition, since the contacts of the conductive body are surrounded and supported by the carrier, the contacts can be prevented from being sunk into the tape when a head of a wire-bonding machine presses the conductive wires onto the contacts. Consequently, the head is able to bond the conductive wires onto the contacts with great accuracy and hence strengthen the bonds between the conductive wires and the contacts.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
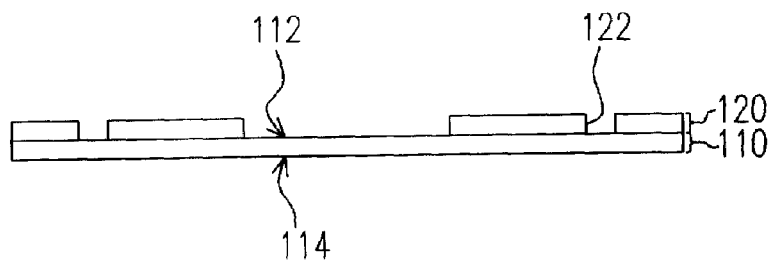
FIGS. 1 to 11 are schematic cross-sectional views showing the progression of steps in a packaging process according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
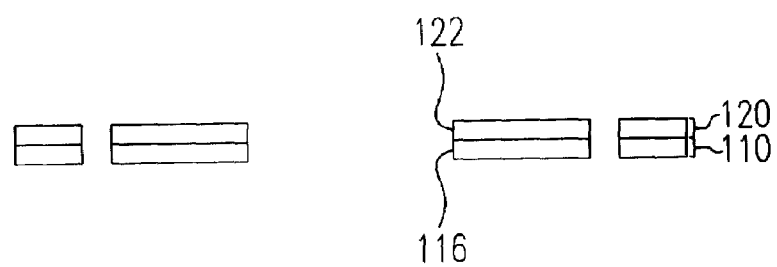

FIGS. 1 to 11 are schematic cross-sectional views showing the progression of steps in a packaging process according to a first preferred embodiment of this invention. First, as shown in FIG. 1, a carrier 110, such as an insulation layer, is provided. The carrier 110 is made from a material, such as glass epoxy resin, Bismaleimide-Triazine, polyimide or epoxy resin. The carrier 110 has an upper surface 112 and a corresponding lower surface 114. A photoresist layer 120 is formed over the carrier 110 by a spincoating process or a thermal-heating process. The photoresist layer 120 is exposed and then developed to transfer a pattern (not shown) to the photoresist layer 120. Hence, a plurality of openings 122 that expose the carrier 110 is formed in the photoresist layer 120. The carrier 110 is etched using the photoresist layer 120 as an etching mask so that the photoresist opening 122 pattern is transferred to the carrier 110. After the etching operation, a plurality of openings are formed in the carrier 110. Locations of the openings 116 in the carrier 110 correspond to the photoresist opening 122 pattern so that the openings 116 in the carrier 110 and the photoresist openings 122 form a continuous passageway as shown in FIG. 2.

Figure 3:
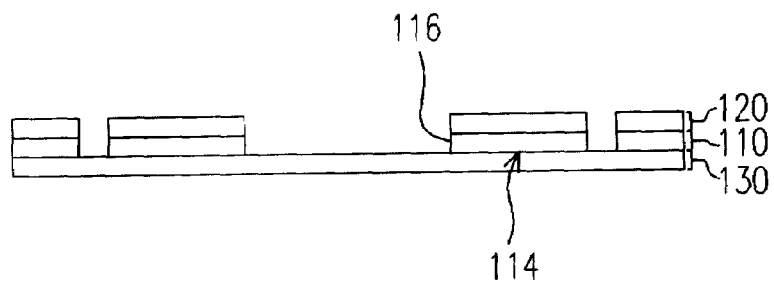
Figure 4:
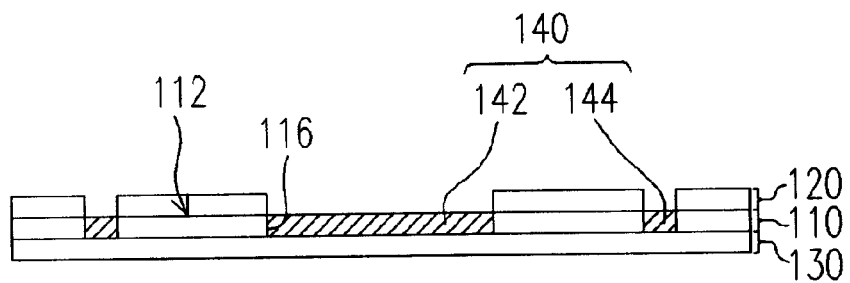
Figure 5:
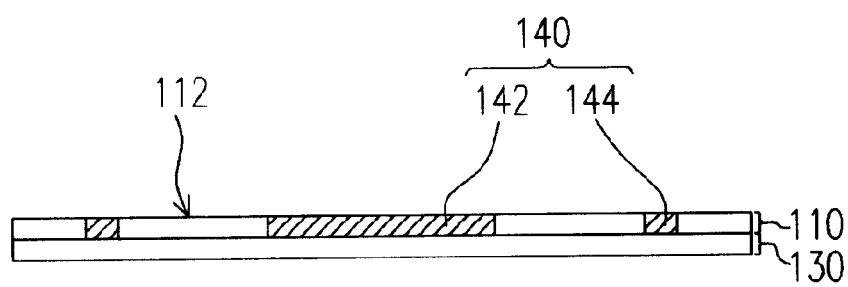
Figure 5A:
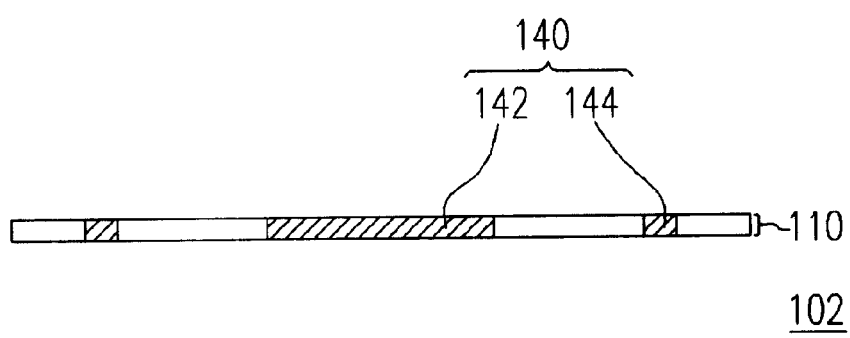

As shown in FIG. 3, a tape 130 is attached to the lower surface 114 of the carrier 110. Thereafter, a conductive material is deposited into the openings 116 in the carrier 110 to form conductive body 140 as shown in FIG. 4. The conductive body 140 is a copper or gold layer formed, for example, by depositing copper or gold into the openings 116 in the carrier 110 using an electroless plating operation. The conductive body 140 can be a composite layer formed by stacking multiple metallic layers, for example, by successively stacking a gold layer, a palladium layer, a nickel layer and a palladium layer. In an ideal condition, the conductive body 140 is filled into the whole of the opening 116. The conductive body 140 has a die pad 142 and a plurality of contacts 144. The contacts 144 surround the die pad 142. Thereafter, the photoresist layer 120 is removed from the upper surface 112 of the carrier 110, as shown in FIG. 5. If the tape 130 is removed from the carrier 110 at this stage as shown in FIG. 5A, a substrate 102 is formed. In this embodiment, the substrate 102 has a carrier 110 and the conductive body 140.

Figure 6:
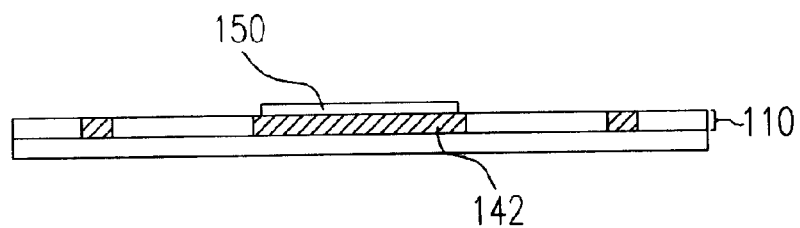
Figure 6A:
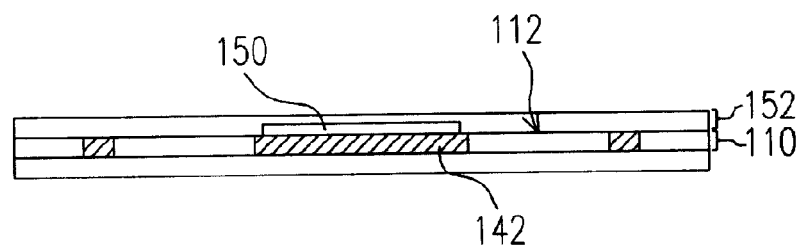
Figure 7:
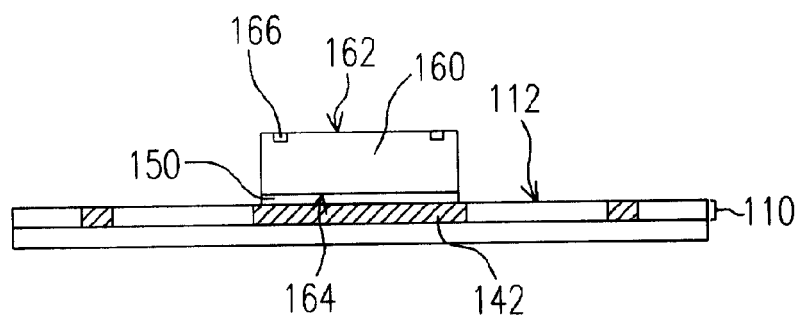

However, the tape 130 may remain attached to the substrate 102 until the final of the packaging process. As shown in FIG. 6, a screen-printing process or a adhesive-dispensing process can be used to form an adhesive 150 over the die pad 142. As shown in FIG. 7, a chip 160 having an active surface 162 and a corresponding backside 164 is provided. The chip 160 has a plurality of chip contacts 166 on the active surface 162. The backside 164 of the chip 160 is attached to the die pad 142 through the adhesive 150. However, the chip 160 may be attached to the adhesive 150 a long time after attaching the adhesive 150 to the die pad 142 as shown in FIG. 6A. In this case, a tape 152 is attached to the adhesive 150 and the upper surface 112 of the carrier 110 after the adhesive 150 is cured so that the adhesive 150 is prevented from any contamination. When it is ready to attach the chip 160, the tape 152 is removed from the carrier 110 and the adhesive 150 and heat is applied to soften the adhesive 150. As soon as the adhesive 150 is softened, the chip 160 is easily attached to the die pad 142.

Figure 8:
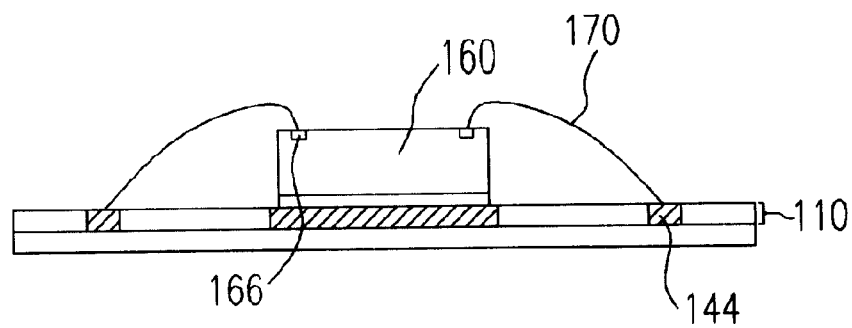
Figure 9:
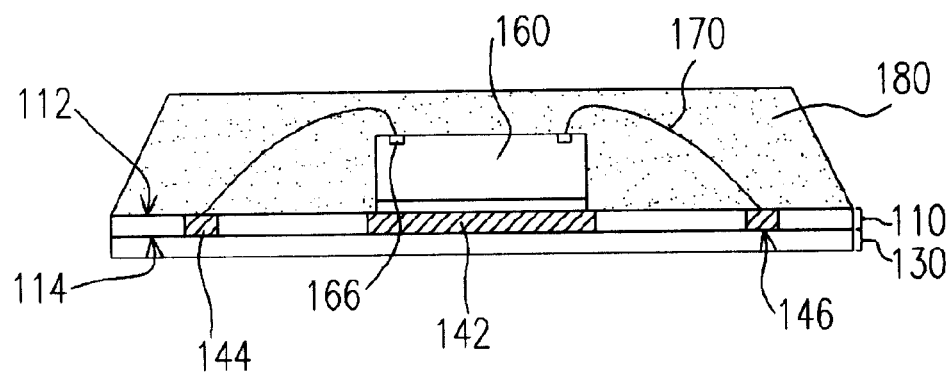
Figure 10:
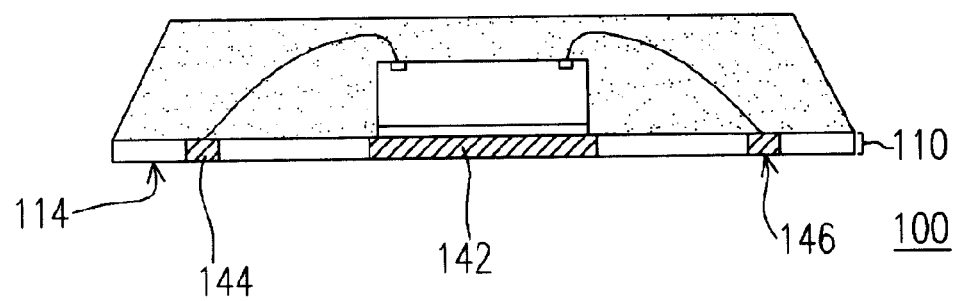

As shown in FIG. 8, a wire-bonding operation is carried out to form a plurality of conductive wires 170 that physically and electrically connects the chip contacts 166 and corresponding contacts 144 on the substrate 102. One end of each conductive wire 170 bonds with the contact 144 while the other end of the conductive wire 170 bonds with the chip contact 166. As shown in FIG. 9, an encapsulating operation is conducted. A packaging material 180 is used to enclose the conductive wires 170 and the chip 160 and to cover the upper surface 112 of the carrier 110. Thereafter, the tape 130 is removed from the lower surface 114 of the carrier 110 and a complete package structure is formed as shown in FIG. 10. Since the tape 130 is removed in the last stage for fabricating the carrier 110, contamination of the surface 146 of the contacts 144 is prevented.

Figure 11:
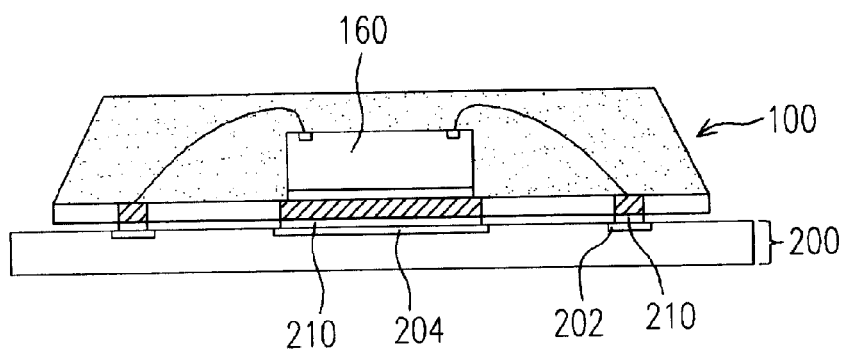

As shown in FIG. 11, a surface mount technology (SMT) may be used to mount the package structure 100 onto a printed circuit board 200. First, a solder material 210 is printed on the contacts 202 and the heat-dissipation pad on the printed circuit board 200. The package structure 100 is placed over the printed circuit board 200 and temporarily adhered to the printed circuit board 200 through the solder material 210. Afterwards, a reflow operation is conducted to cure the solder material 210. Hence, the package structure 100 is firmly attached to the printed circuit board 200. Through the heat-dissipation pad 204, heat generated by the chip 160 is easily dissipated to the surrounding. This type of package structure 100 also has superior electrical properties.

In the aforementioned embodiment, any metal etching operation can be dramatically avoided. Hence, the fabrication process according to this invention is able to reduce environmental pollution considerably. Furthermore, this invention only requires a single reflow operation, thereby reducing the warpage level of the substrate 101. Thus, the substrate 102 can have a higher degree of surface planarity. Because the contacts 144 are supported by surrounding carrier 110 material, the caving of contacts 144 into the tape 130 can be prevented when a head of a wire-bonding machine presses the conductive wires 170 onto the contact 144. Therefore, the head is able to bond the conductive wires 170 onto the contacts 144 precisely. Ultimately, reliability of the bond between the conductive wires 170 and the contacts 144 is improved.

In the aforementioned embodiment, the substrate is a single-layered structure with the chip and the substrate electrically connected through conductive wires. However, the scope of this invention is not limited to this application. In the second embodiment of this invention, the substrate is a multi-layered carrier and the chip and the substrate are electrically connected through bumps.

Figure 12:
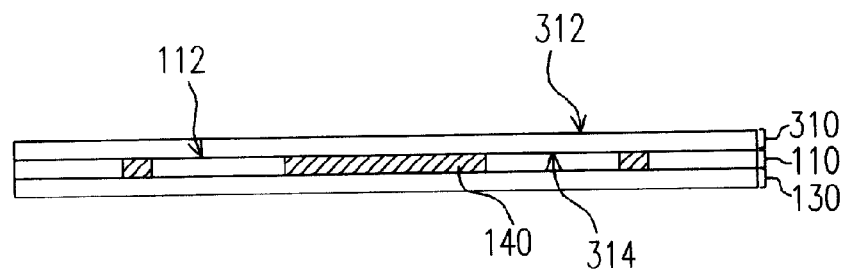
FIGS. 12 to 18 are schematic cross-sectional views showing the progression of steps in a packaging process according to a second preferred embodiment of this invention.
Figure 13:
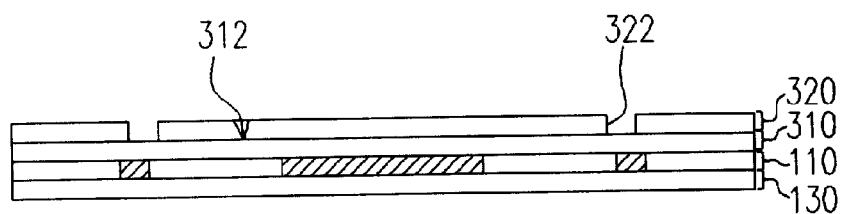
Figure 14:
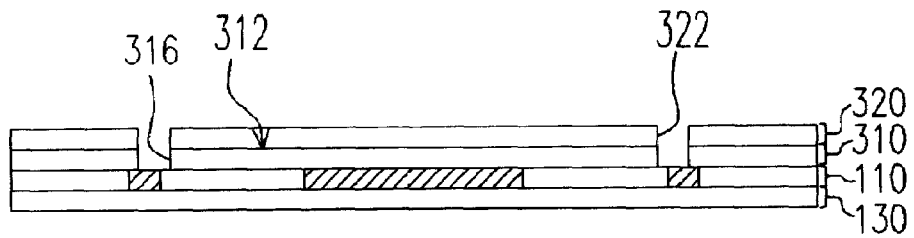
Figure 15:
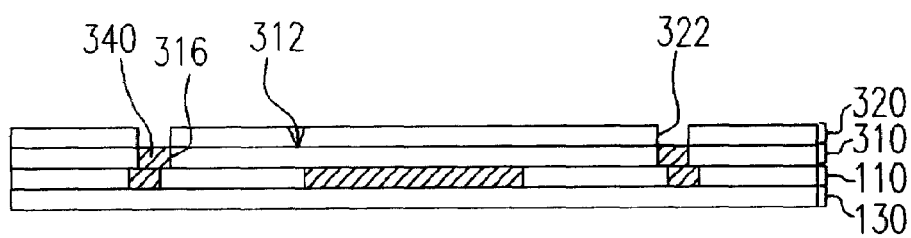
Figure 16:
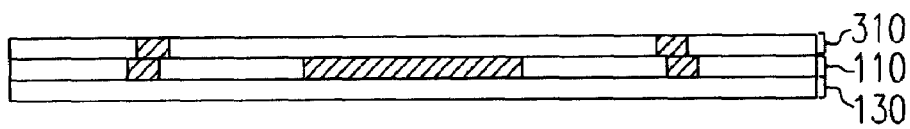
Figure 16A:
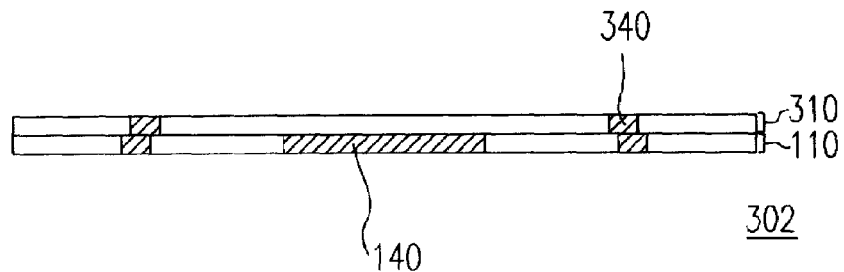

FIGS. 12 to 18 are schematic cross-sectional views showing the progression of steps in a packaging process according to a second preferred embodiment of this invention. First, as shown in FIG. 12, a carrier 110, a tape 130 and a conductive body 140 are formed using the processes as shown in FIGS. 1 to 5. Thereafter, an additional carrier 310, such as an additional insulation layer, is formed over the upper surface 112 of the carrier 110 by conducting a heat-pressing or spin-coating operation. The additional carrier 310 is made from a material, such as glass epoxy resin, Bismaleimide-Triazine, polyimide or epoxy resin. The carrier 310 has an upper surface 312 and a corresponding lower surface 314. The lower surface 314 of the carrier 310 is attached onto the carrier 110. Thereafter, a photoresist layer 320 is formed on the upper surface 312 of the carrier 310 by spin-coating, for example. The photoresist layer 320 is exposed and developed to transfer a pattern (not shown) to the photoresist layer 320. The patterned photoresist layer 320 has a plurality of openings 322 that expose the carrier 310 as shown in FIG. 13. The carrier 310 is etched using the photoresist layer 320 as an etching mask so that the photoresist opening 322 pattern is transferred to the carrier 310. After the etching operation, a plurality of openings 316 is formed in the carrier 310. Locations of the openings 316 in the carrier 310 correspond to the photoresist opening 322 pattern so that the openings 316 in the carrier 310 and the photoresist openings 322 form a continuous passageway as shown in FIG. 14. Thereafter, a conductive material is deposited into the openings 316 in the carrier 310 to form a conductive body 340 as shown in FIG. 15. The conductive body 340 is a copper or gold layer formed, for example, by depositing copper or gold into the openings 316 in the carrier 310 in an electroless plating operation. The conductive body 340 can be a composite layer formed by stacking multiple metallic layers, for example, by successively stacking a gold layer, a palladium layer, a nickel layer and a palladium layer. In an ideal condition, the conductive body 340 is filled into the whole of the opening 316. The conductive body 340 has a plurality of contacts, for example, for communicating signals with the external circuits. Thereafter, the photoresist layer 320 is removed from the carrier 310, as shown in FIG. 16. If the tape 130 is removed from the carrier 110 at this stage as shown in FIG. 16A, a substrate 302 with multiple metal layers and insulation layers is formed. In this embodiment, the substrate 302 has two carriers 110 and 310 as well as two conductive bodies 140 and 340. However, by repeating the aforementioned processes, a substrate having more than two metal layers and insulation layers is produced.

Figure 17:
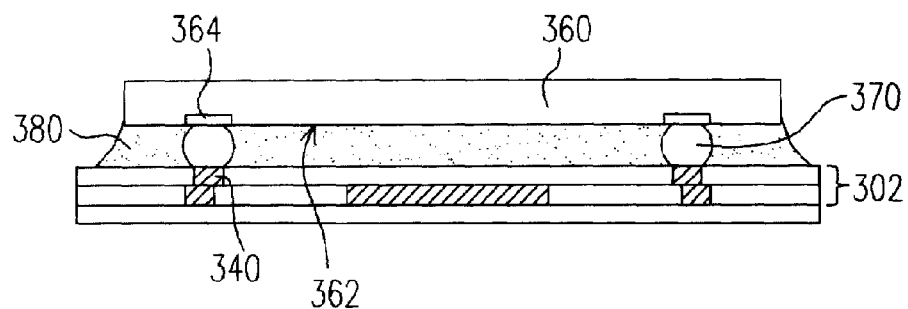
Figure 18:
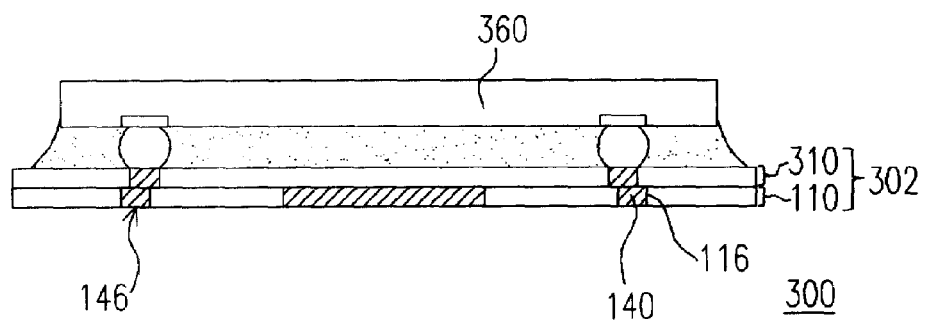

The tape 130 may remain attached to the substrate 102 until the final of the packaging process. As shown in FIG. 17, a flip-chip process is conducted to physically and electrically connect a chip 360 to the substrate 302 through a plurality of bumps 370. The chip 360 has an active surface 362 and a plurality of chip contacts 364 and the chip contacts 364 are formed on the active surface 362. In the step, the bumps are first formed on the chip contacts 364 and then the chip 360 is moved with the active surface 362 of the chip 360 facing the substrate 302 and the bumps 370 attached on a solder material (not shown) that is formed on the contacts of the conductive body 340, for example, by a screen-printing process. A reflow process is conducted to bind the bumps 370 with the solder material. The bumps 370 physically and electrically connect the chip contacts 364 with the contacts 340 on the upper surface of the substrate 302. In other words, one end of each bump 370 is bonded to the chip contact 364 while the other end of the bump 370 is bonded to the contact 340 on the substrate 302. After the chip 360 is firmly attached to the substrate 302 through the bumps 370, an insulation material 380 is filled into the space between the chip 360 and the substrate 302 and encloses the bumps 370. Thereafter, the tape 130 is removed from the substrate 302, as shown in FIG. 18, thereby forming a complete package structure 300. Since the tape 130 is removed from the substrate 302 in the last stage of the package fabrication, contamination of the surface 146 of the conductive body 140 in the openings 116 of the lower carrier 110 is prevented.

In the aforementioned process, the conductive bodies are formed in the openings of the carriers before removing the photoresist layer. However, it is also permissible to form the conductive bodies in the openings of the carriers after removing the photoresist layer. FIGS. 19 to 27 are schematic cross-sectional views showing the progression of steps in a packaging process according to a third preferred embodiment of this invention.

Figure 19:
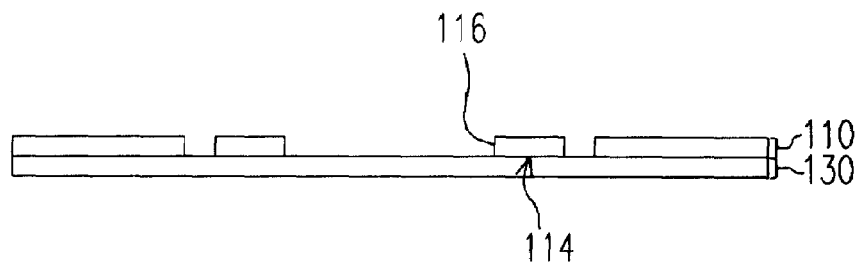
FIGS. 19 to 27 are schematic cross-sectional views showing the progression of steps in a packaging process according to a third preferred embodiment of this invention.
Figure 20:
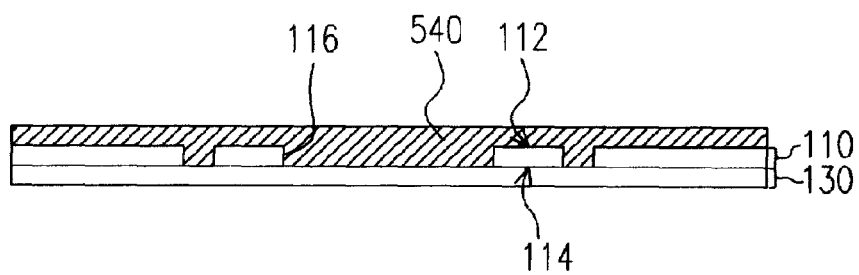
Figure 21:
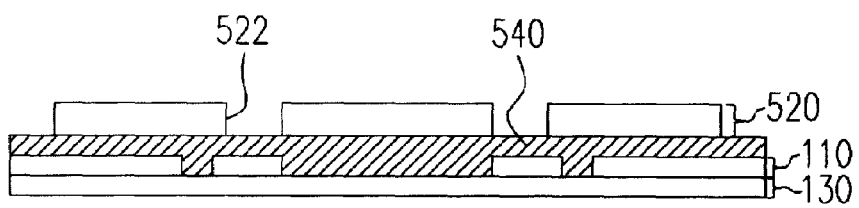
Figure 22:
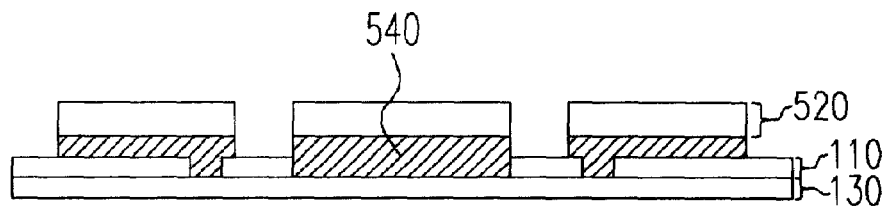

First, as shown in FIG. 2, after the openings 116 are formed in the carrier 110 using the photoresist layer 120, the photoresist layer 120 is removed from the carrier 110. Thereafter, a tape 130 is formed on the lower surface 114 of the carrier 110 as shown in FIG. 19. Conductive material is deposited to form a conductive body 540 by conducting an electroless plating operation, a sputter process or an electroplating process. The conductive body 540 is filled into the openings 116 in the carrier 110 and covers the upper surface 112 of the carrier 110 as shown in FIG. 20. The conductive body 540 is a layer of copper or gold, for example. The conductive body 540 may also be a composite layer formed by stacking multiple metallic layers, for example, by successively stacking a gold layer, a palladium layer, a nickel layer and a palladium layer. A photolithogrphy process is next conducted by forming a photoresist layer 520 over the conductive body 540, exposing the photoresist layer 520 and developing the photoresist layer 520 thereafter. Ultimately, a pattern (not shown) is transferred to the photoresist layer 520 so that the photoresist layer 520 has a plurality of photoresist openings 522 that exposes the conductive body 540 as shown in FIG. 21. The conductive body 540 is etched using the photoresist layer 520 as an etching mask so that the pattern of the conductive body 540 over the carrier 110 matches the pattern in the photoresist layer 520 as shown in FIG. 22.

Figure 23:
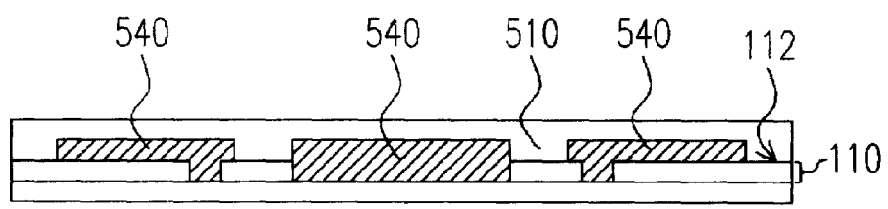
Figure 24:
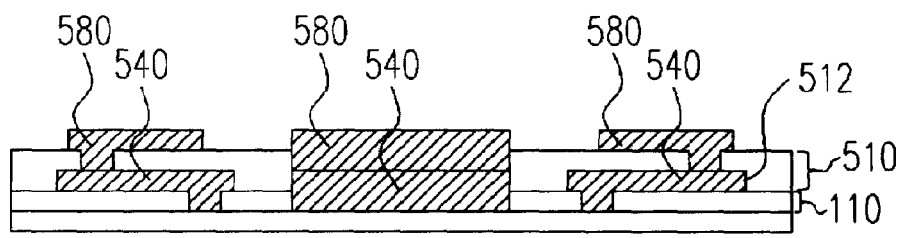
Figure 25:
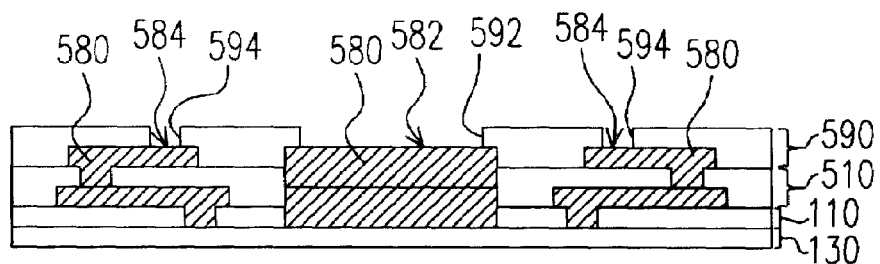
Figure 25A:
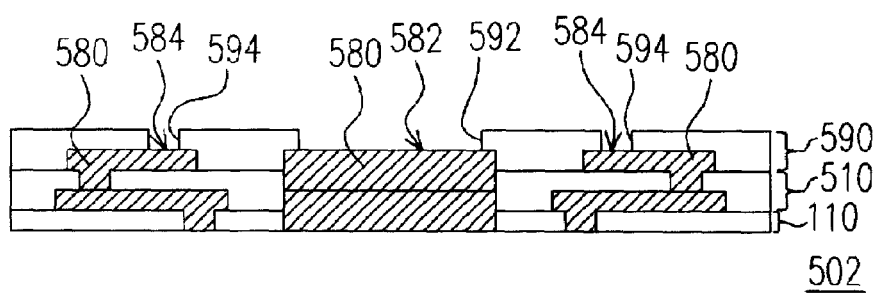

A heat-pressing method or spin-coating and curing methods is used to form an additional carrier 510, such as an insulation layer, over the upper surface 112 of the carrier 110 as well as the conductive body 540 as shown in FIG. 23. The previous steps for forming the conductive bodies can be repeated to form an additional conductive body 580 in the openings 512 of the carrier 510 and over the carrier 510 and the conductive body 540 as shown in FIG. 24. Next, a solder mask layer 590 is selectively formed over the carrier 510 and the conductive body 580. The solder mask layer 590 is patterned to form a first opening 592 and a plurality of second openings 594. Through the first opening 592 and the second openings 594, the conductive body 580 is exposed to the outside. The conductive body 580 exposed by the first opening 592 forms a die pad 582 while the conductive body exposed by the second openings 594 forms a plurality of contacts 584 as shown in FIG. 25. If the tape 130 is removed at this stage, a complete substrate 502 is fabricated as shown in FIG. 25A.

Figure 26:
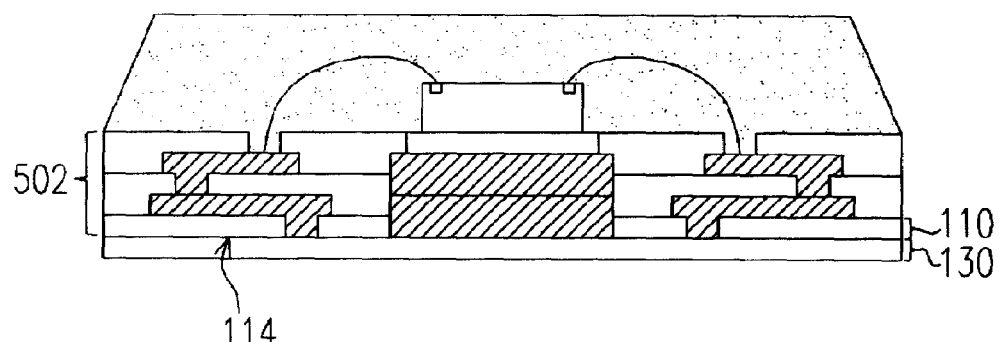
Figure 27:
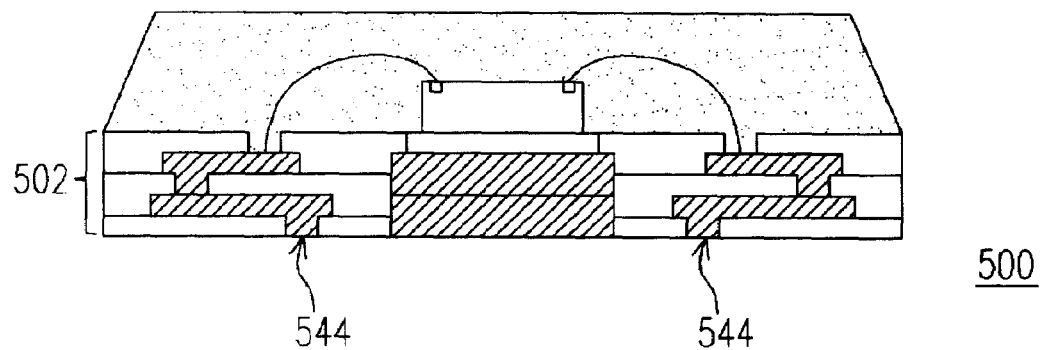

The tape 130 may remain attached to the substrate 502 until the final of the packaging process. The subsequent steps for fabricating the structure as shown in FIG. 26 is similar to the first embodiment of this invention, and the detailed description is not repeated. Finally, the tape 130 is removed from the lower surface 114 of the carrier 110 to form a package structure 500 as shown in FIG. 27. Since the tape 130 is removed from the carrier 110 in the last step, surface contamination of the contacts 544 is reduced. The package 500 can be later attached to a printed circuit board (not shown) using a surface mount technology. The printed circuit board connects electrically with the package 500 through its contacts 544.

In conclusion, major advantages of this invention include: 1. Since the packaging process demands no metallic etching operation, environmental pollution is greatly reduced. 2. Since only one reflow step is required, the warpage level of the substrate is reduced. Ultimately, the surface of a substrate can have a higher degree of planarity. 3. Because the contacts are surrounded and supported by the carrier, the caving of contacts into the tape can be prevented when a head of a wire-bonding machine presses the conductive wires onto the contact. Therefore, the head is able to bond the conductive wires onto the contacts precisely. Ultimately, reliability of the bond between the conductive wires and the contacts is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A packaging process, comprising:
    providing an insulation layer, wherein the insulation layer has an upper surface and a corresponding lower surface;
    forming a plurality of openings passing through the insulation layer;
    attaching a tape onto the lower surface of the insulation layer;
    forming a conductive body inside the openings, wherein the conductive body has a die pad and a plurality of contacts and a formation of the conductive body is completed when the step of forming the conductive body inside the openings is concluded;
    mounting a chip over the upper surface of the insulation layer, wherein the chip has an active surface, a corresponding backside and a plurality of chip contacts on the active surface and the chip is electrically connected with the conductive body by attaching the backside of the chip onto the die pad, electrically connecting the chip contacts with the contacts of the conductive body via a plurality of conductive wires, and forming a packaging material to encapsulate the chip and the conductive wires; and
    removing the tape.

2. The packaging process of claim 1, wherein forming the conductive body inside the openings comprises electroless plating.

3. The packaging process of claim 1, wherein before mounting the chip over the upper surface of the insulation layer, a multi-layer substrate is formed by further conducting the steps comprising:
    forming an additional insulation layer over the insulation layer;
    forming a plurality of openings passing through the additional insulation layer; and
    forming an additional conductive body inside the openings of the additional insulation layer.

4. The packaging process of claim 1, wherein before mounting the chip over the upper surface of the insulation layer, a multi-layer substrate is formed by repeating the steps comprising:
    forming an additional insulation layer over the insulation layer;
    forming a plurality of openings passing through the additional insulation layer; and
    forming an additional conductive body inside the openings of the additional insulation layer.

5. The packaging process of claim 1, wherein material constituting the conductive body includes copper.

6. The packaging process of claim 1, wherein material constituting the conductive body includes gold.

7. The packaging process of claim 1, wherein the conductive body is a composite structure comprising multiple metallic layers.

8. The packaging process of claim 1, wherein the conductive body is a composite structure comprising a gold layer, a palladium layer, a nickel layer and a palladium layer.

9. The packaging process of claim 1, wherein material constituting the insulation layer is selected from a group consisting of glass epoxy resin, Bismaleimide-Triazine, polyimide and epoxy resin.

* * * * *